US007675951B2

(12) United States Patent
Nakatani

(10) Patent No.: US 7,675,951 B2
(45) Date of Patent: Mar. 9, 2010

(54) THRESHOLD VOLTAGE DIFFERENCE ALLOWABLE SEMICONDUCTOR LASER DRIVING APPARATUS

(75) Inventor: Yasukazu Nakatani, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/869,194

(22) Filed: Jun. 16, 2004

(65) Prior Publication Data

US 2005/0002429 A1    Jan. 6, 2005

(30) Foreign Application Priority Data

Jul. 1, 2003    (JP) .............................. 2003-189551

(51) Int. Cl.
*H01S 3/00* (2006.01)
(52) U.S. Cl. .................. 372/38.03; 372/38.07
(58) Field of Classification Search .............. 372/38.03, 372/38.07
See application file for complete search history.

(56) References Cited

U.S. PATENT DOCUMENTS

| 6,356,161 | B1 * | 3/2002 | Nolan et al. ................. 331/176 |
| 6,532,245 | B1 * | 3/2003 | Paschal et al. ........... 372/38.02 |
| 7,372,882 | B2 * | 5/2008 | Horiuchi et al. .......... 372/38.02 |
| 7,499,479 | B2 * | 3/2009 | Nishimura .................. 372/38.1 |
| 2003/0189961 | A1 * | 10/2003 | Tsuji et al. ............... 372/38.02 |

* cited by examiner

*Primary Examiner*—Minsun Harvey
*Assistant Examiner*—Marcia A. Golub
(74) *Attorney, Agent, or Firm*—Cooper & Dunham, LLP

(57) ABSTRACT

A semiconductor laser driving apparatus controls a semiconductor laser to output a prescribed intensity of laser light. The semiconductor laser driving apparatus includes at least two semiconductor laser driving circuits each outputting a prescribed amount of current to the semiconductor laser when operated, and a control circuit selectively transmitting a control signal and controlling one or more semiconductor laser driving circuits to operate in accordance with a prescribed intensity of laser light to be irradiated from the semiconductor laser.

15 Claims, 9 Drawing Sheets

THRESHOLD VOLTAGE DIFFERENCE ALLOWABLE SEMICONDUCTOR LASER DRIVING APPARATUS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

The present specification relates generally to a semiconductor laser driving apparatus for driving a semiconductor laser such as a laser diode and similar devices, and in particular to a semiconductor laser driving apparatus formed from a current mirror circuit capable of reading and writing information in an optical disc at a high speed while widely changing a control current.

2. Discussion of the Related Art

A conventional semiconductor laser driving apparatus generally supplies a laser diode LD with small to large currents with a current mirror circuit as shown in FIG. 11. Specifically, in the conventional laser driving apparatus, a pair of PMOS transistors Pa and Pb is connected to a power supply voltage VDD through their sources. Respective gates of the pair of PMOS transistors are connected at a connection point to each other. The connection point is connected to a drain of the PMOS transistor Pa. Thereby, a current mirror circuit is achieved.

A constant current source ISa is connected to the drain of the PMOS transistor Pa via a switch SWa, and thereby a constant current ia can flow thereto. Since the PMOS transistors Pa and Pb form a current mirror circuit, a current ib is supplied from the PMOS transistor Pb to the laser diode LD in accordance with a ratio between sizes of the PMOS transistors Pa and Pb. For example, when the ratio of the sizes of Pa and Pb is one versus two, a ratio between currents 1a and 1b is also one versus two.

Further, a control signal Sa input from a control circuit (not shown) turns ON/OFF the switch SWa. The current ib is controlled to be supplied in response to opening/closing of the switch SWa, and thereby the laser diode LD is turned ON and OFF. However, the laser diode LD does not irradiate a beam immediately after the switch SWa is turned ON and is closed.

Specifically, voltages of the gate and drain of the PMOS transistor Pa remains higher than a conduction level (i.e., VDD−Vth) initially, because the switch SWa is turned OFF and is open, and thus a current does not flow. The sign Vth represents a threshold voltage for the PMOS transistor Pa in the above.

Immediately when the switch SWa is turned ON in this situation, the current ia flows from the constant current source ISa, and thereby the gate and drain voltages start descending. However, since a parasitic capacitance Ca parasitizes with the PMOS transistors Pa and Pb, the switch SWa, and a wiring and so on, it takes a certain time to discharge some of charge stored in the parasitizing capacitance Ca, and a stand up performance of the output current ib saturates from when the switch SWa is turned ON to when the output current ib reaches a prescribed level as shown in FIG. 12. As a result, a delay time Tdr appears. Further, when the output current ib falls down to zero, a delay time Tdf appears.

Such saturation and delay of the stand up performance raises a problem, because it takes a certain time to discharge the parasitic capacitance Ca especially when the currents ib, and accordingly ia flowing from the constant current source ISa are small. Further, since each of source-gate voltages Vgs of the PMOS transistors Pa and Pb is small when each of the currents ia and ib is small, a difference ΔVth in a threshold voltage created by uneven manufacturing processes for manufacturing the PMOS transistors Pa and Pb apparently changes a ratio between currents ia and ib, which becomes a drawback.

Specifically, a current Idp flowing to a drain of a PMOS transistor is generally calculated by the following formula in a saturation range, wherein Kp is obtained by the following formula, and wherein μp represents a surface displacement degree of channel carrier, Cox represents a gate oxide film capacity, W represents a channel width, L represents a channel length, Vgs represents a souse-gate voltage (an absolute value), and Vth represents a threshold voltage (an absolute value).

$$Idp = Kp \times (Vgs - Vth)^2 / 2 \qquad (a)$$

$$Kp = \mu p \times Cox \times W/L$$

When a small difference ΔVth takes place between the threshold voltages Vth of the PMOS transistors Pa and Pb due to uneven manufacturing processes, a difference in a current caused by the threshold voltage difference ΔVth is small, because the source-gate voltage Vgs is large when the current Idp is large. However, since the source-gate voltage Vgs is small, accordingly, the effect by the difference ΔVth is not negligible, and the above mentioned conduction level (Vgs−Vth) is duplicated when the current Idp is small, the smaller the source-gate voltage Vgs, the exponentially larger the difference in the current Idp.

Specifically, even if no problem occurs in the circuit of FIG. 11 when a large current flows into the laser diode LD, the slight difference ΔVth creates a considerable difference in the output current ib when a small current flows thereto, and thereby the current mirror circuit loses precision in current control, which becomes as a problem.

SUMMARY

Accordingly, an object of the present invention is to address and resolve such and other problems and provide a new and improved semiconductor laser driving apparatus. The above and other objects are achieved according to the present application by providing a semiconductor laser driving apparatus that controls a semiconductor laser to output prescribed intensity of laser light. The semiconductor laser driving apparatus, according to one embodiment includes a plurality of semiconductor laser driving circuits each outputting a prescribed amount of current to the semiconductor laser when operated, and a control circuit selectively transmitting a control signal and controlling one or more of the semiconductor laser driving circuits to operate in accordance with prescribed intensity of laser light to be obtained from the semiconductor laser.

In another embodiment, the control circuit operates a prescribed number of semiconductor laser driving circuits in accordance with the laser light intensity to be obtained from the semiconductor laser.

In yet another embodiment, each of the semiconductor laser driving circuits includes a first constant current source from which a prescribed amount of constant current flows, a current mirror circuit generating and supplying the semiconductor laser with a prescribed amount of current in accordance with the prescribed amount of constant current, and a switch circuit selectively allowing the prescribed amount of constant current to flow into an input side transistor of the current mirror circuit in response to the control signal transmitted from the control circuit.

In yet another embodiment, a ratio of sizes between the input and output side transistors is substantially the same in each of the current mirror circuits.

In yet another embodiment, the semiconductor laser driving circuit includes a second constant current source that always supplies a prescribed current to the input side transistor.

In yet another embodiment, the semiconductor laser driving circuits are formed on an integrated circuit, and the control circuit is formed on another integrated circuit.

In yet another embodiment, the semiconductor laser driving circuits are integrated on a semiconductor chip, the control circuit is formed on another semiconductor chip, and these semiconductor chips form a multiple chip state integrated circuit.

In yet another embodiment, a bypass circuit (BP in FIG. 1A) is provided to cause a total current to bypass and substantially not be supplied to the semiconductor laser. In the preferred embodiment, the total current is obtained by collecting the currents output from the semiconductor laser driving circuits.

In yet another embodiment, the semiconductor laser driving circuits and bypass circuit are formed on an integrated circuit, and the control circuit is formed on another integrated circuit.

In yet another embodiment, the semiconductor laser driving circuits and bypass circuit are integrated on a semiconductor chip, and said control circuit is formed on another semiconductor chip. In the preferred embodiment, the semiconductor chips form a multiple chip state integrated circuit.

BRIEF DESCRIPTION OF DRAWINGS

A more complete appreciation of the features of the present disclosure and many of the attendant advantages thereof can be readily obtained from the following detailed description when considered in connection with the accompanying drawings, wherein.

PREFERRED EMBODIMENTS OF THE PRESENT INVENTION

Figure 1:
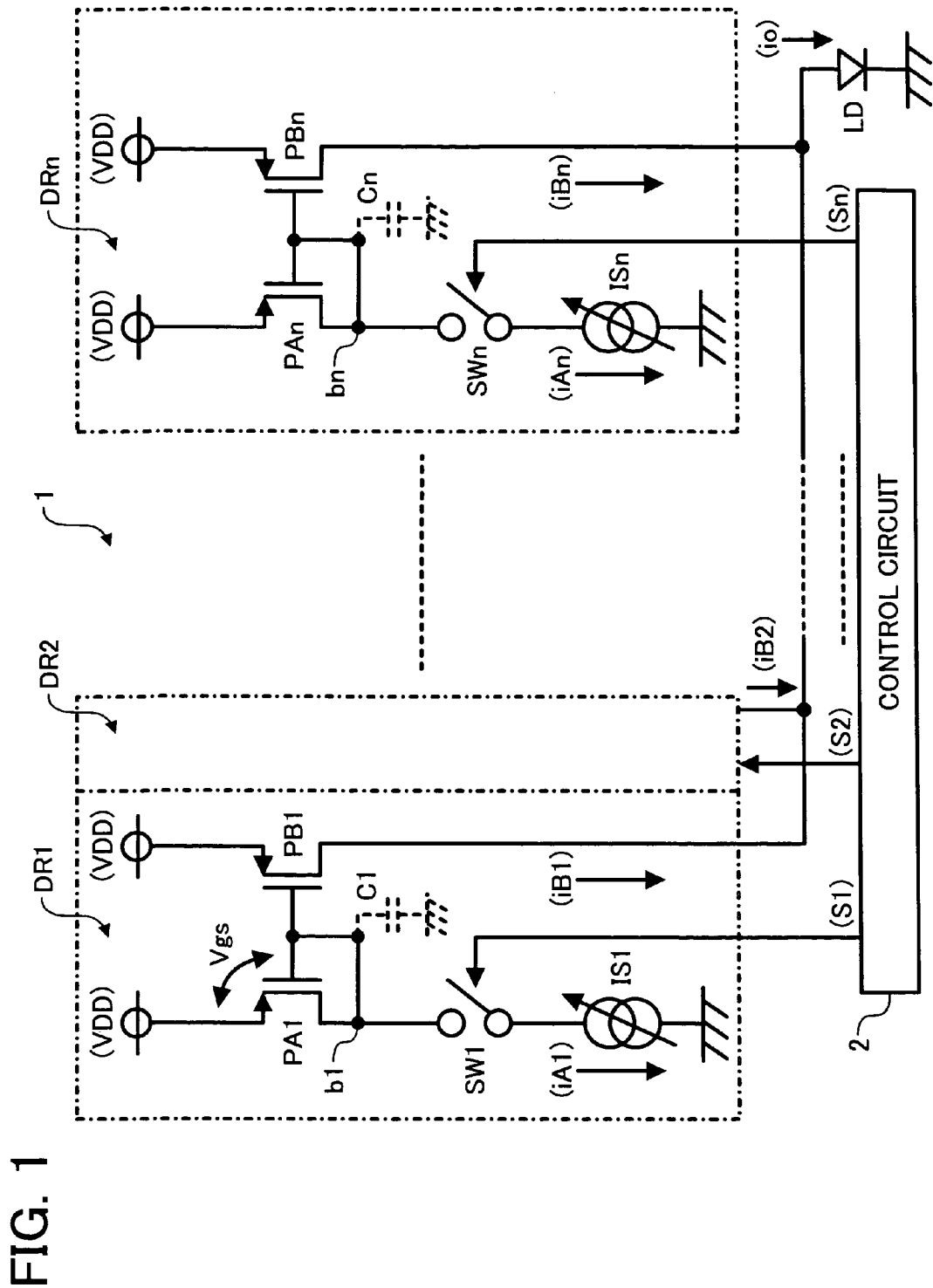
FIG. 1 illustrates a circuit of a semiconductor laser driving apparatus according to one exemplary embodiment of the present invention.
Figure 1A:
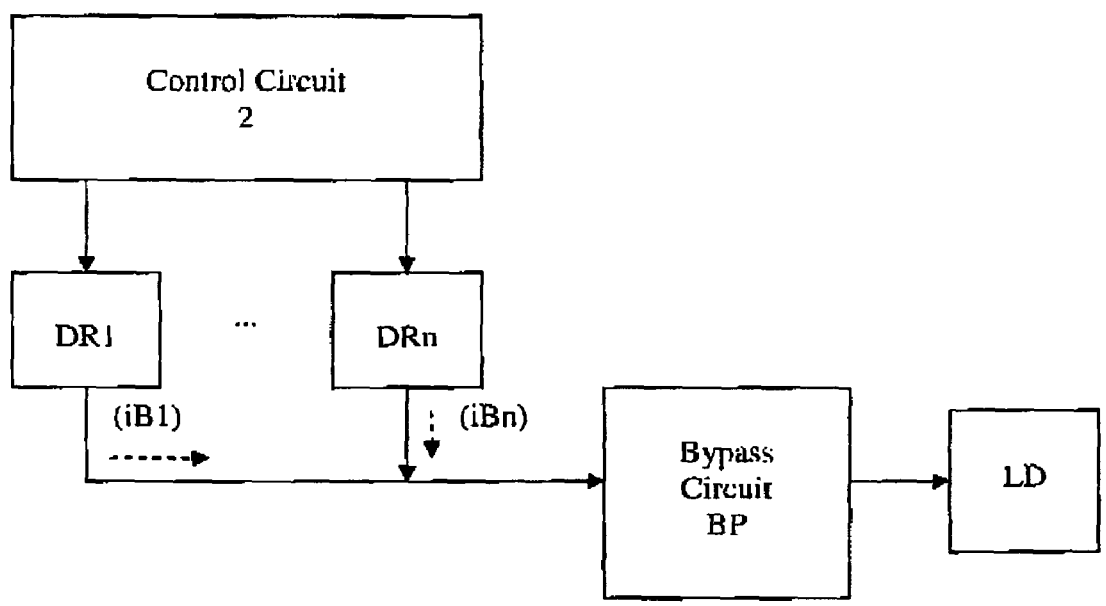
FIG. 1A illustrates a block diagram of a semiconductor laser driving apparatus according to another exemplary embodiment.

Referring now to the drawings, wherein like reference numerals designate identical or corresponding parts throughout several views, and in particular FIG. 1, a semiconductor laser driving apparatus preferably includes a plurality of semiconductor laser driving circuits DR1 to DRn each supplying a laser diode LD with a current, wherein the suffix n represents an integer more than one, and a control circuit 2 controlling these semiconductor laser driving circuits DR1 to DRn to operate. Specifically, the control circuit 2 may selectively output control signals S1 to Sn and drive applicable one or more semiconductor laser driving circuits DR1 to DRn in accordance with a value of a current io to be supplied to the laser diode LD. For example, a prescribed number of semiconductor laser driving circuits DR1 to DRn is selected and driven in accordance with a prescribed light intensity to be irradiated from the laser diode LD.

The plurality of semiconductor laser driving circuits DR1 to DRn are preferably formed on an integrated circuit. The control circuit 2 is also preferably an integrated circuit type. These two IC semiconductor chips can form a multiple chip package so as to form one integrated circuit. By forming these semiconductor laser driving circuits DR1 to DRn and control circuit 2 on the integrated circuit, a multiple chip type configuration is preferably employed so that a power supply voltage for the semiconductor laser driving circuits DR1 to DRn can be large, and a power supply voltage for the control circuit 2 can be small. The reason why the power supply voltage for the semiconductor laser driving circuits DR1 to DRn is large is that a current supplied to a laser diode LD, and accordingly an irradiation value of the laser diode, can be increased, thereby resulting in speeding up in irradiation of the laser diode LD. Further, it is desirable that the power supply voltage of the control circuit 2 is decreased because a miniaturization is required in a high speed operation.

Hereinafter, an optional semiconductor lasers driving circuit DRm (m=1 to n) is typically described, because the respective semiconductor laser driving circuits DR1 to DRn are substantially the same configurations to each other. The semiconductor laser driving circuit DRm may include a pair of PMOS transistors PAm and PBm, a switch SWm, and a constant current source ISm serving as a first constant current source. The pair of PMOS transistors PAm and PBm may collectively form a current mirror circuit. Respective sources of the pair of PMOS transistors PAm and PBm are preferably connected to a power supply voltage VDD. Respective gates of the PMOS transistors PAm and PBm may be connected to each other. A connection point between the gates is preferably connected to a drain of the PMOS transistor PAm. Between the connection point and ground, a capacitance Cm parasitizing to a wiring and so on may be provided beside the pair of PMOS transistors PAm and PBm and the switch SWm.

The switch SWm and a constant current source ISm may be serially connected between the drain of the PMOS transistors PAm and ground. A laser diode LD may be connected between the drain of the PMOS transistors PBm and ground. A control signal Sm may be input from the control circuit 2 to the switch SWm so as to open and close the switch. When the switch SWm is turned ON and is closed, a current iAm may flow from the constant current source ISm into the PMOS transistor PAm. Then, a current iBm is preferably output from the drain of the PMOS transistor PBm to the laser diode LD in accordance with the current iAm.

Figure 2:
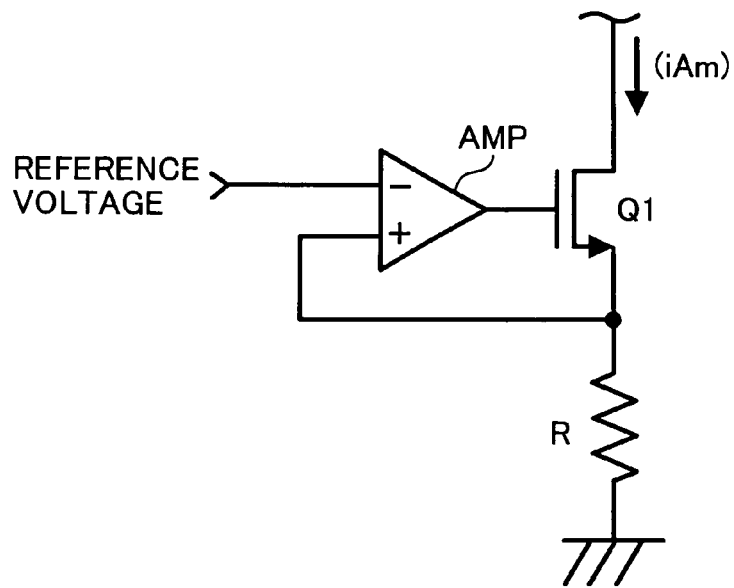
FIG. 2 illustrates an exemplary circuit forming each of constant current sources IS1 to ISn illustrated in FIG. 1.
Figure 3:
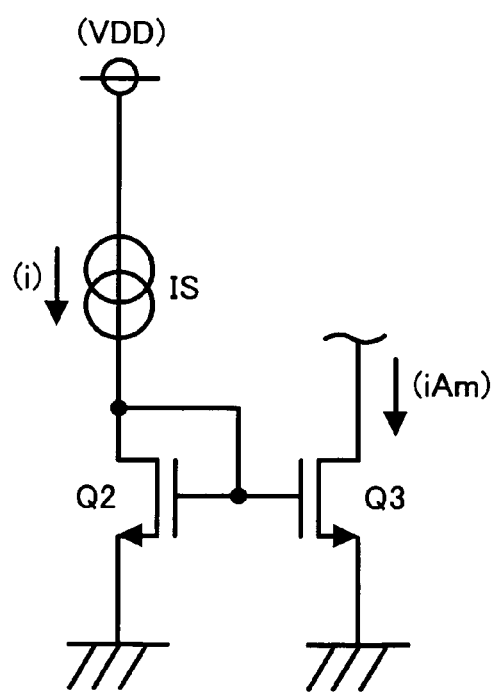
FIG. 3 illustrates another exemplary circuit forming each of constant current sources IS1 to ISn illustrated in FIG. 1.

A constant current source ISm can be formed from a circuit configuration as shown in FIG. 2 or FIG. 3. A voltage-current conversion circuit (FIG. 2) is formed from a resistor R, an operational amplifier AMP, and an NMOS transistor Q1. The constant current source ISm of FIG. 3 may be configured to return a constant current i flowing from the constant current source IS by means of a current mirror circuit formed from the NMOS transistors Q2 and Q3. A current type D/A converter can be used as a constant current source ISm as an alternative.

Figure 11:
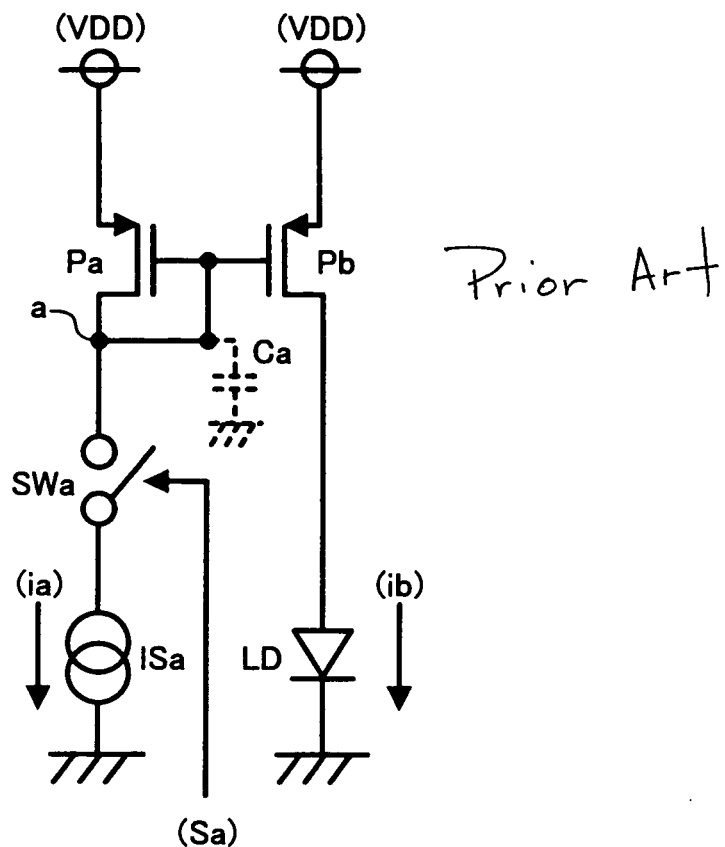
FIG. 11 illustrates a conventional semiconductor laser driving apparatus.
Figure 12:
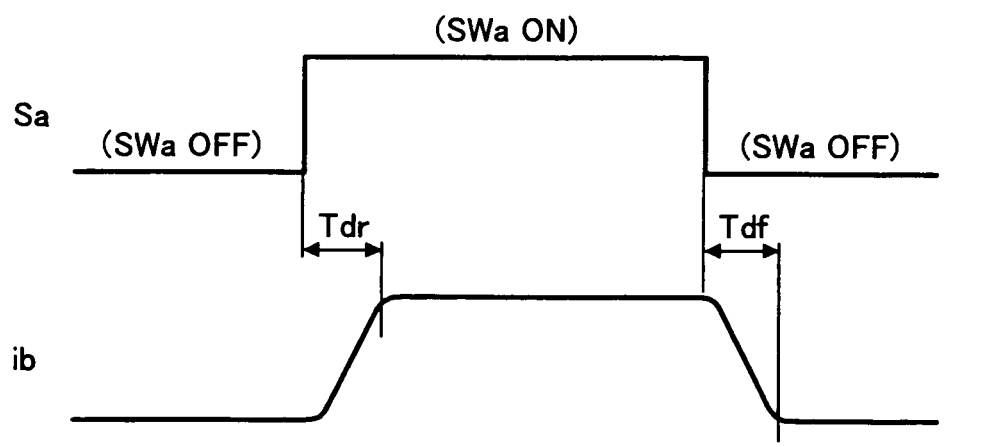
FIG. 12 illustrates exemplary waves appearing at various sections illustrated in FIG. 11.

An exemplary operation of the semiconductor laser driving apparatus 1 of FIG. 1 is now described in comparison with a conventional circuit of FIG. 11. The semiconductor laser driving apparatus 1 is preferably designed such that the sum of current supplying ability of PMOS transistors PA1 to PAn is substantially the same as a current supplying ability of the PMOS transistor Pa of FIG. 11, and the sum of current supplying ability of the PMOS transistors PB1 to PBn is substantially the same as a current supplying ability of the PMOS transistor Pb of FIG. 11.

The total of switch elements SW1 to SWn is substantially the same as the switch Swa in size. The total of constant current source elements IS1 to ISn is substantially the same as the constant current source ISa in amount. The total of currents iA1 to iAn is substantially the same as the current ia in amount. Further, the total currents iB1 to iBn is substantially the same as the current ib. Thus, it is designed that a current value supplied to the laser diode LD when the switches SW1 to SWn are turned ON and thus are closed is substantially the same as when the switch SWa is turned ON and is closed.

Figure 4:
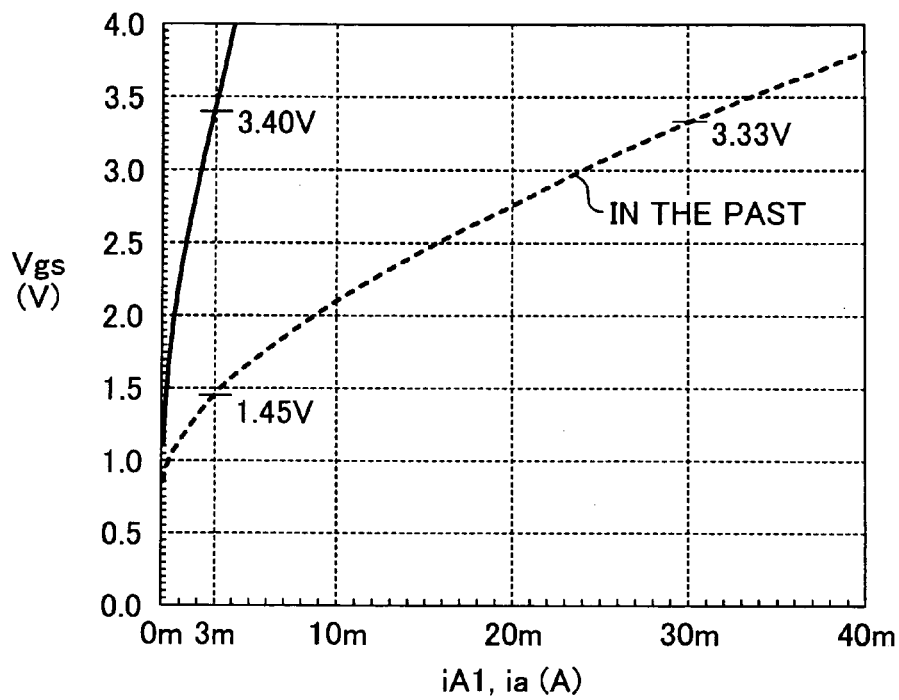
FIG. 4 is a chart illustrating an exemplary relation between a source-gate voltage Vgs and a current iA1 flowing in a PMOS transistor PA1 illustrated in FIG. 1.

Referring now to FIG. 4, an exemplary relation between a source-gate voltage Vgs and a current iA1 of the PMOS transistor PA1 is described, wherein the suffix n is ten and the maximum value, i.e., the sum of currents iA1 to iA10, is about 30 milli-Amperes. In the chart shown in FIG. 4, a rigid line represents performance of the PMOS transistor PA1. A dotted line represents performance of the conventional PMOS transistor Pa. Further, in the example shown in FIG. 4, when the current iA1 is changed from zero to 40 milli-Amperes, the source-gate voltage Vgs represents performance as indicated by the rigid line.

Referring back to FIG. 1, when the suffix N is ten, and if the switches SW1 to SW10 are turned ON and are closed, and the sum of the currents is changed to be the same as the current ia described with reference to FIG. 11, while operating the constant current sources IS1 to IS10 in the same manner, each of source-gate voltages Vgs of respective PMOS transistor PA1 to PA10 may show performance shown by the rigid line in FIG. 4. That is, each of the PMOS transistors PA1 to PA10 is a tenth part in size of the PMOS transistor Pa of FIG. 11, but each of the currents iA1 to iA10 flowing from the constant current sources IS1 to IS10 is also a tenth part, and an operational condition per a unit element is substantially the same for each element.

Since the PMOS transistor Pa has a sufficient source-gate voltage Vgs when the current ia flowing in the PMOS transistor Pa is larger than ten milli-Amperes, influence on an output current ib may be small, even if a slight difference $\Delta Vth$ exists between the threshold voltages Vth of the PMOS transistors Pa and Pb. In contrast, when the current ia is small, for example, less than a few milli Amperes, since the source-gate voltage Vgs of the PMOS transistor Pa is small, a change in an output current ib caused by the difference $\Delta Vth$ may be substantially enlarged and can raise a problem.

Contribution of the difference $\Delta Vth$ to a change in an output current ib output from the semiconductor laser driving apparatus 1 to the laser diode LD is simulated on conditions that the difference $\Delta Vth$ is five milli-volts, a current value io supplied to the laser diode is changed from io1 to sufficiently smaller io2, the threshold voltage Vth is 0.8 volts, and the suffix n is ten. Since a value of the current flowing from the output terminal of each of the current mirror circuits varies in synchronism with a source-gate voltage Vgs in the input side PMOS transistor, a difference of a current flowing in a primary side current mirror circuit is simulated.

An example is described below on conditions that the sum of currents iA1 to iA10 is 30 milli-Amperes when a current io1 is supplied to the laser diode LD. Each of currents iA1 to iA10 flowing from the constant current sources IS1 to IS10 may be three milli-Amperes. When referring to the performance shown by the rigid line of FIG. 4, it is understood that a source-gate voltage Vgs of each of the PMOS transistors PA1 to PA10 is 3.40 volts when a primary side current of the current mirror circuit is three milli-Amperes.

Thus, each of drain currents idp of the PMOS transistors PA1 to PA10, which are substantially the same as each other, may be calculated by the following formula using the above-mentioned formula (a):

$$idp = Kp \times (3.40-0.8)^2/2 = 3.38Kp$$

If the difference $\Delta Vth$ of five milli-Volts arises in the threshold voltages Vth, the drain current idp may be calculated as follows:

$$idp = Kp \times (3.40-0.8-0.005)^2/2 = 3.37Kp$$

A ratio between the sum of drain currents idp flowing in the PMOS transistor PA1 to PA10 when the difference $\Delta Vth$ is five milli-Volts and the sum of drain currents idp flowing in the PMOS transistor PA1 to PA10 when the $\Delta Vth$ is less than five milli-Volts may be 0.3% as calculated by the following formula, and is small:

$$(33.8Kp - 33.7KP)/33.8Kp = 0.003$$

Further, when a current io2 is supplied to the laser diode LD and only a semiconductor laser driving circuit DR1 supplies a current to the lased diode LD, the same effect may be obtained. Specifically, a ratio between a drain current idp flowing in the PMOS transistor PA1 when the difference $\Delta Vth$ is five milli-Volts and the current idp flowing in the PMOS transistor PA1 when the difference $\Delta Vth$ is less than five milli-Volts may be 0.3% as calculated by the following formula, and is small:

$$(3.38Kp - 3.37KP)/3.38Kp = 0.003$$

In contrast, in the conventional semiconductor laser driving apparatus of FIG. 11, when a current io1 is supplied to the laser diode LD and the current ia is thirty milli-Amperes, the source-gate voltage Vgs of the PMOS transistor Pa is 3.33 volts as shown by the dotted line in FIG. 4.

Thus, the drain current idp of the PMOS transistor Pa is calculated by the following formula using the above-mentioned formula (a):

$$idp = Kp \times (3.33-0.8)^2/2 = 3.20Kp$$

If the difference ΔVth of five milli-Volts arises, the drain current idp may be calculated as follows:

$$dp = Kp \times (3.33 - 0.8 - 0.005)^2/2 = 3.19Kp$$

Thus, a ratio between the drain current idp flowing in the PMOS transistor Pa when the difference ΔVth is five milli-Volts and the current idp flowing in the PMOS transistor Pa when the difference ΔVth is less than five milli-Volts may be 0.31% as calculated by the following formula, and is small indeed:

$$(3.20Kp - 3.19Kp)/3.20Kp = 0.0031$$

However, when the current ia is three milli-Amperes when a prescribed current io2 is supplied to the laser diode LD, the source-gate voltage Vgs of the PMOS transistor Pa is as indicated by the dotted line in FIG. 4.

Thus, the drain current idp of the PMOS transistor Pa is calculated by the following formula using the above-mentioned formula (a):

$$idp = Kp \times (1.45 - 0.8)^2/2 = 0.21125Kp$$

If the difference ΔVth arises, the drain current idp may be calculated as follows:

$$idp = Kp \times (1.45 - 0.8 - 0.005)^2/2 = 0.20801Kp$$

As a result, a ratio between the drain current idp flowing in the PMOS transistor Pa when the difference ΔVth is five milli-Volts and the current idp flowing in the PMOS transistor Pa when the difference ΔVth is less than five milli-Volts may be 1.53%, and is five times as much as the case of thirty milli-Amperes as shown by the following formula:

$$(0.21125Kp - 0.20801Kp)/0.21125Kp = 0.0153$$

When the current supplied to the laser diode LD is smaller, the difference in a current exponentially increases. As apparent from the above-mentioned comparison, the semiconductor laser driving apparatus 1 according to the first preferred embodiment may effectively suppress a difference in a current supplied to a laser diode LD which is cased by unevenness of a PMOS transistor.

Influence to a rise time of a current io supplied to a laser diode LD is described below. In the conventional semiconductor laser driving apparatus, since the PMOS transistors Pa and Pb forming a current mirror circuit are constant in size, a parasitic capacitance Ca is constant. Thus, since a current ia of a constant current source ISa is correspondingly small when an output current ib supplied to the laser diode LD is small, it takes a certain time period to discharge the parasitic capacitance Ca and change voltages of respective gates of the PMOS transistors Pa and Pb. As a result, a standup performance of the current supplied to the laser diode LD is generally saturated and delayed. This can be an obstacle to high-speed writing onto an optical disc and the like.

In contrast, in the semiconductor laser driving apparatus according to the first embodiment, since a number of semiconductor laser driving circuits to be driven can be decreased when an output current io is small, parasitic capacitances C1 to Cn can be relatively smaller as a result in comparison to currents supplied by the constant current sources IS1 to Isn. In addition, even when the output current io is small, saturation and delay of a standup performance of the current io can be suppressed as described below in detail.

Figure 5:
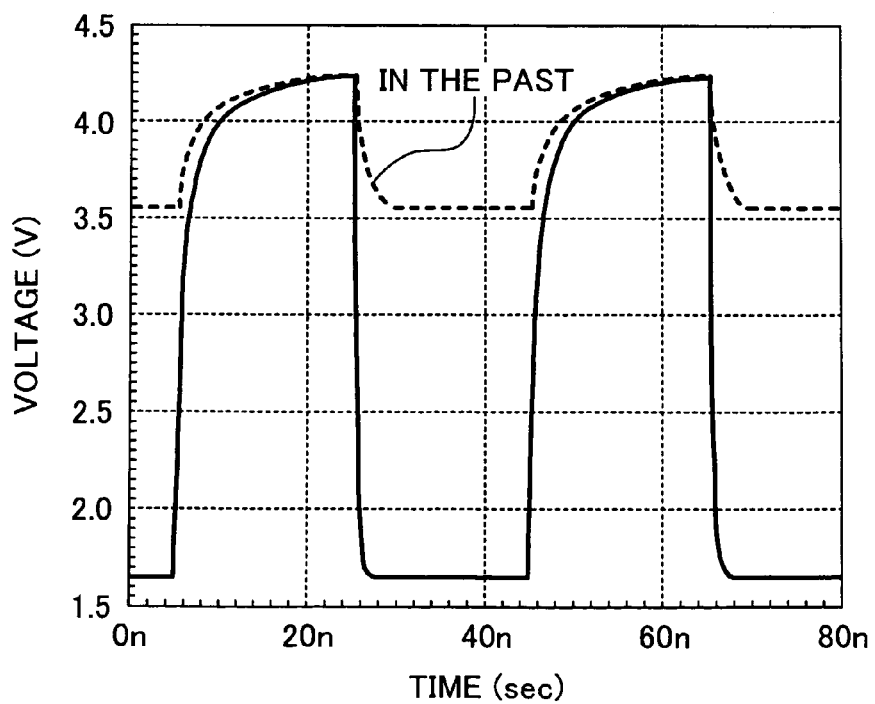
FIG. 5 is a chart showing an exemplary simulation wave of a gate voltage of a PMOS transistor PA1.

Specifically, in FIG. 5, a rigid line illustrates an exemplary simulation result of a wave of a gate voltage of a PMOS transistor PA1 when a current iA1 is three milli-Amperes, and a dotted line illustrates an exemplary simulation result of a wave of a gate voltage of a PMOS transistor Pa when a current ia is 3 milli-Amperes as mentioned with reference to FIG. 11. FIG. 5 represents a situation in which only a control signal S1 is turned ON, and switches SW2 to SW10 corresponding to the other control signals S2 to S10 are turned OFF and thus are open. As shown in FIG. 5, it is unclear which one settled earlier.

However, since transistors forming a current mirror circuit outputting a current of three milli-Amperes to the laser diode LD is a tenth part in size, a source-gate voltage Vgs of the PMOS transistor PA1 increases, and an amplitude of a gate voltage of the PMOS transistor PA1 becomes larger when the control signal S1 is turned ON.

Figure 6:
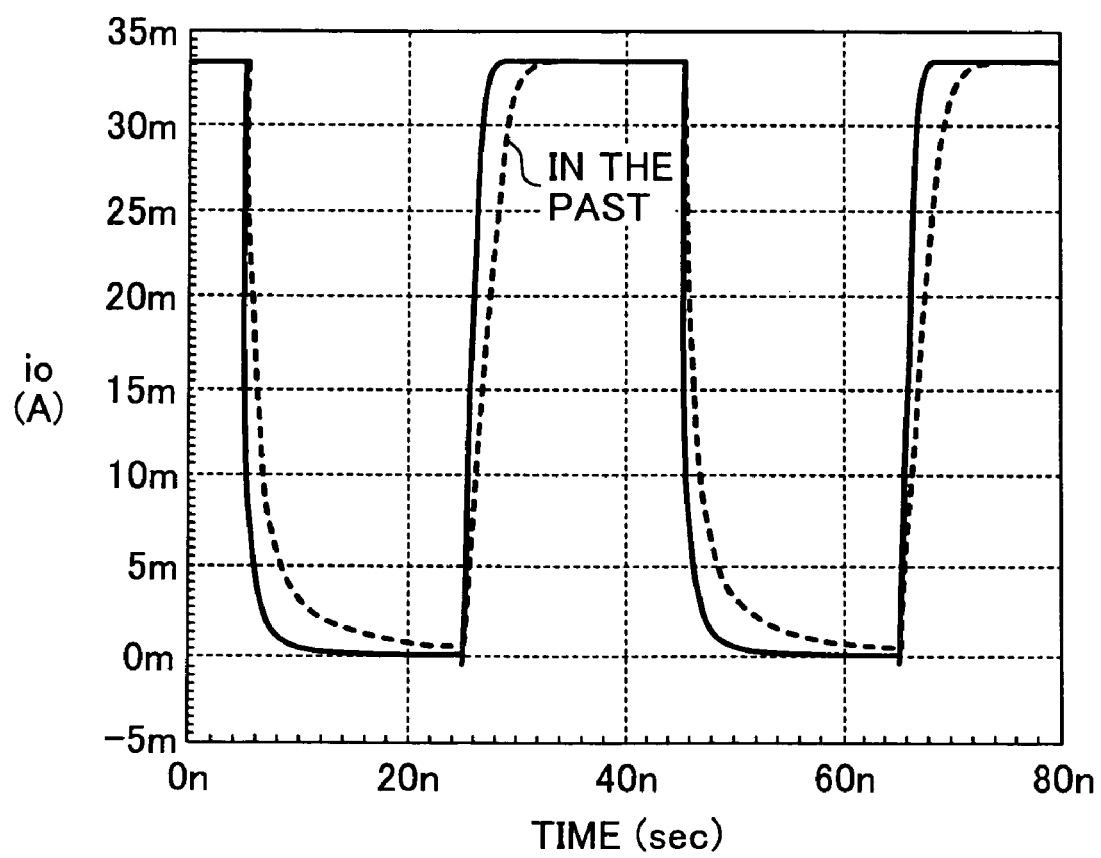
FIG. 6 is a chart illustrating exemplary performance of a current output to a laser diode LD.

In contrast, as shown in FIG. 6 which illustrates an exemplary performance of a current output to a laser diode LD, settling of the output current of the semiconductor laser driving apparatus 1 according to the first embodiment is faster than that of the conventional semiconductor laser driving apparatus, wherein a wave shown by a rigid line represents a simulation result in the semiconductor laser driving apparatus according to the first embodiment, and a wave shown by a dotted line represents a simulation result in the conventional semiconductor laser driving apparatus. As understood therefrom, an effect of reduction in the parasitic capacitance down to a tenth part appears in comparison with a case when the same amount of currents flows from the constant current source.

Hereinbelow, another preferred embodiment is described. As mentioned heretofore, in the first preferred embodiment, after the switch is turned OFF by control signals S1 to Sn transmitted by the control circuit 2, the gate voltage is increased by the current flowing in its primary side PMOS transistor. Then, when the gate voltage becomes the conduction level (Vdd−Vth), the PMOS transistor is turned OFF, and the current output to the laser diode LD becomes the ground level (i.e., zero).

However, as the gate voltage increases, i.e., the source-gate voltage Vgs decreases, the current flowing in the PMOS transistor of the primary side accordingly decreases, and a rising speed of the gate voltage rapidly decreases. As a result, a dropping speed of the current output to the laser diode LD becomes slower.

Further, when the transistor of the input side of the current mirror circuit is turned OFF, a node of a gate of the input side transistor can become a high impedance state and is accordingly a high voltage higher than the conduction level (Vdd−Vth). In such a situation, a gate voltage of the PMOS transistor is generally unstable. Further, an interval from when the switch is turned ON by the control signals to when the output current to the laser diode LD starts rising occasionally varies. In order to resolve such problems, an additional constant current source is preferably employed and connected to the gate of PMOS transistors forming the current mirror circuit in the second preferred embodiment so that a stationary current flows therefrom.

Figure 7:
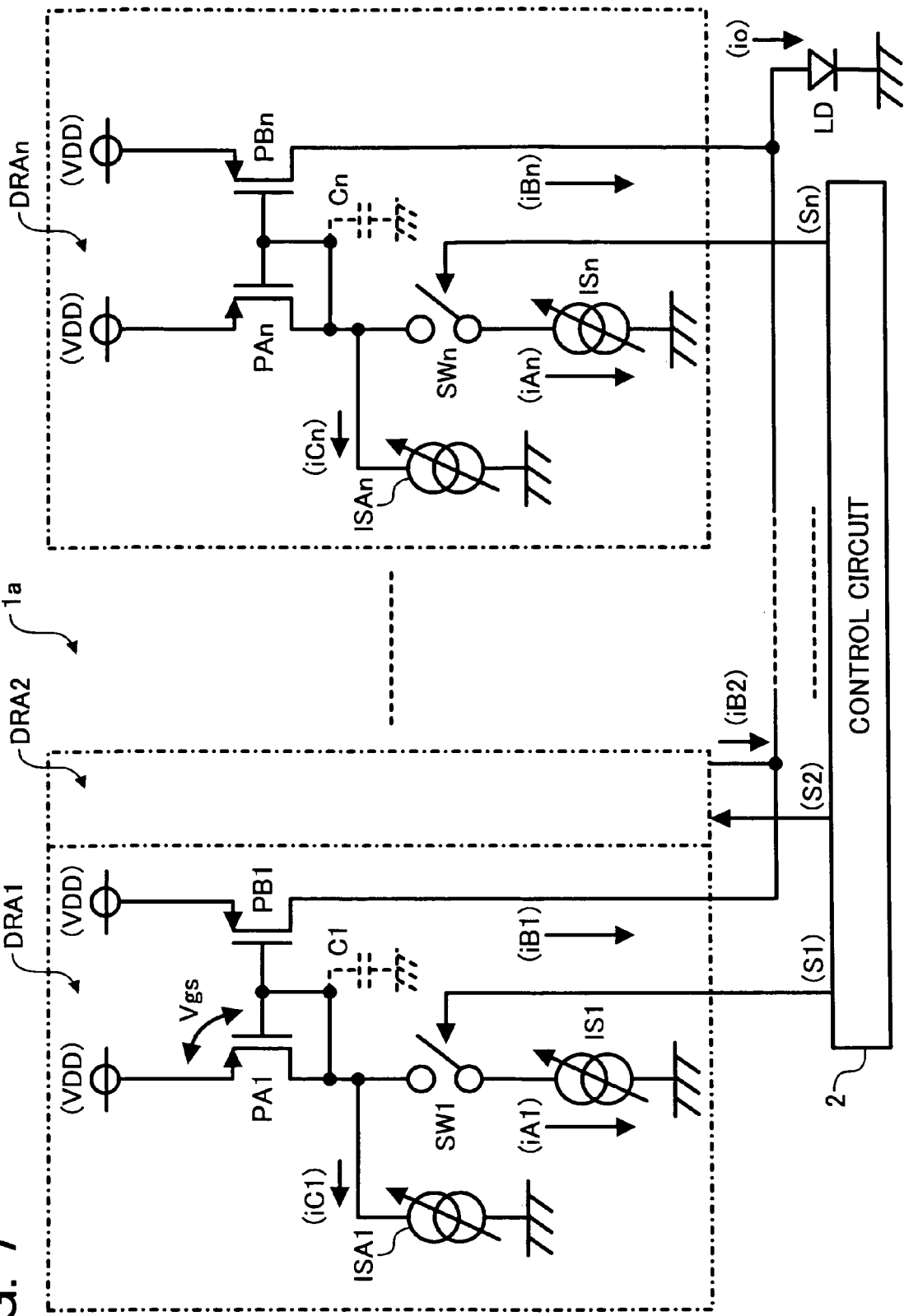
FIG. 7 illustrates a semiconductor laser driving apparatus according to a second exemplary embodiment of the present invention.

Specifically as shown in FIG. 7, constant current sources ISA1 to ISAn are employed in a semiconductor laser driving circuits DR1 to DRn similar to those shown in FIG. 1. Specifically, the semiconductor laser driving circuits DR1 to DRn of FIG. 1 correspond to semiconductor laser driving circuits DRA1 to DRAn, and the semiconductor laser driving apparatus 1 of FIG. 1 corresponds to a semiconductor laser driving apparatus 1a in FIG. 7.

As shown, the semiconductor laser driving apparatus 1a includes, but not limited to, the semiconductor laser driving circuits DRA1 to DRAn each supplying a laser diode LD with a current, wherein the suffix n represents integer number more than one, and a control circuit 2 controlling the semiconductor laser driving circuits DRA1 to DRAn to operate. The control circuit 2 may output control signals S1 to Sn to the semiconductor laser driving circuits DRA1 to DRAn, respectively, and may selectively drive prescribed one or more semiconductor laser driving circuits DRA1 to DRAn in accordance with a value of a current to be supplied to the laser diode LD. Specifically, the control circuit 2 selectively drives a prescribed number of semiconductor laser driving circuits DRA1 to DRAn in accordance with intensity of a light irradiated from the laser diode LD.

Since the semiconductor laser driving circuits DRA1 to DRAn have substantially the same circuit configuration as each other, an optional semiconductor laser driving circuits DRAm (m=1 to n) is typically described. The semiconductor laser driving circuits DRAm includes, but is not limited to, a pair of PMOS transistors PAm and PBm, a switch SWm, and constant current sources ISm and ISAm. The constant current source ISAm may serve as a second constant current source. The constant current source ISAm may be connected to a connection point between gates of the PMOS transistors PAm and PBm at its one side and ground at its another side. The constant current source ISAm can be the circuit illustrated in FIG. 2 or 3.

With an optional current iCm flowing from the constant current source ISAm in such a configuration, a settling speed of a gate voltage of the PMOS transistor PAm can be increased and the gate voltage can be constant when the switch SWm is turned OFF.

As a result, a stable operation can be obtained.

Figure 8:
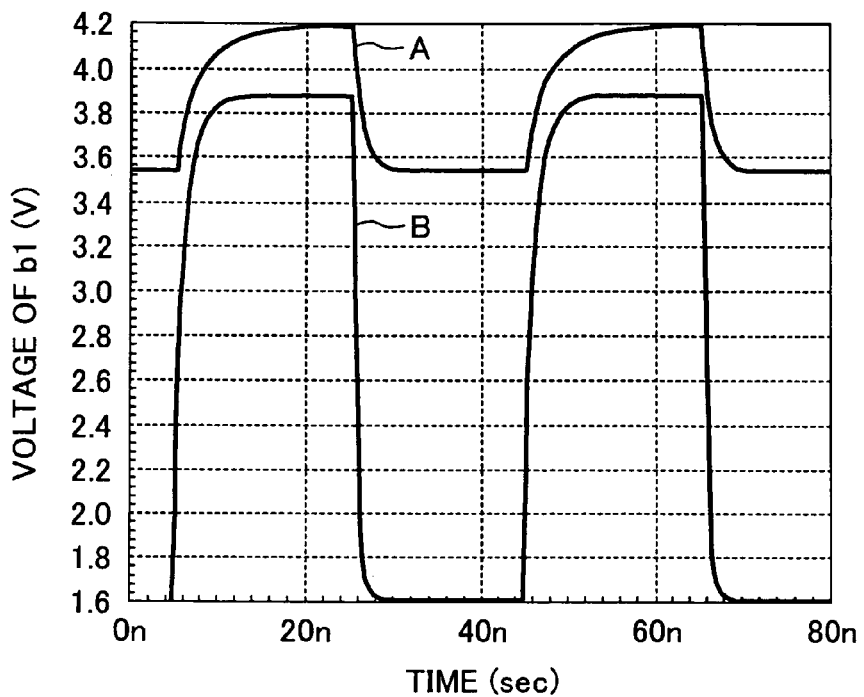
FIG. 8 illustrates an exemplary signal wave appearing at a connection point of respective gates of the PMOS transistors PA1 and PB1 of the semiconductor laser driving circuit DRA1 illustrated in FIG. 7.

In FIG. 8, an exemplary signal wave appearing at a connection point between gates of the PMOS transistors PA1 and PB1 in the semiconductor laser driving circuit DRA1 is illustrated when the sign n is ten, wherein in performance "A" represents a case when each of the semiconductor laser driving circuits DRA1 to DRA10 outputs a current of three milli-Amperes to the laser diode LD, and performance "B" represents another case when only the semiconductor laser driving circuit DRA1 operates and outputs a current of three milli-Amperes to the laser diode LD.

Figure 9:
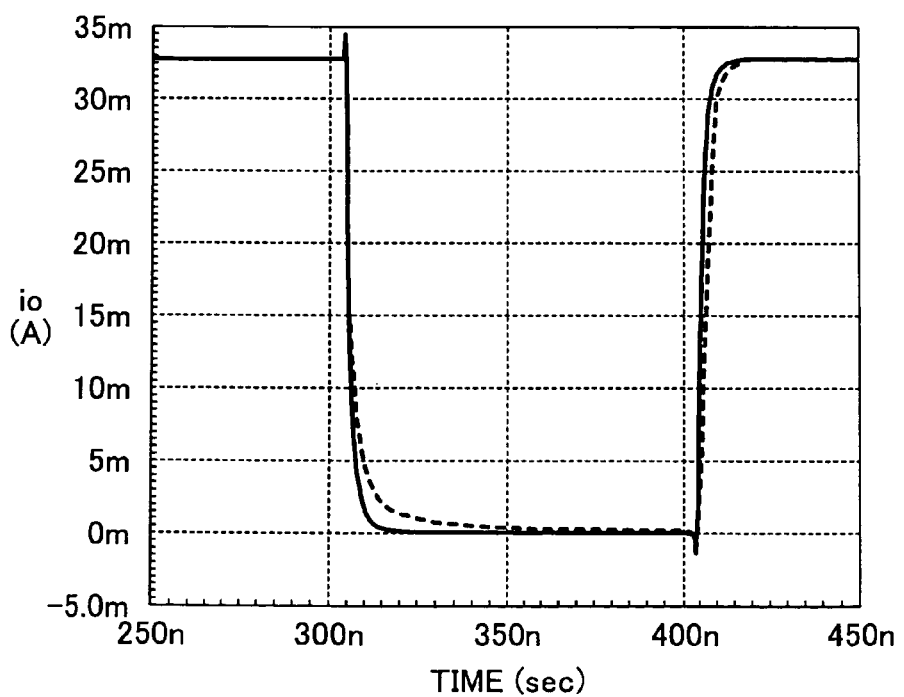
FIG. 9 is a chart illustrating exemplary performance of an output current in illustrated in FIG. 1.

In FIG. 9, exemplary performances of the output current io are described when the total currents from iC1 to iC10 flowing from the constant current sources ISA1 to ISA10 are totally zero and 10 milli-Amperes, respectively, when the suffix n is ten. In the drawing, a rigid line may represent the performance of the output current io when the total currents is 10 milli-Amperes. A dotted line may represent the performance when the total currents is zero milli-Amperes.

For the purpose of easy comparison of the settling time, the performance is represented lower by ten milli-Amperes as an offset from the practical output current io when the total currents is ten milli-Amperes. As understood therefrom, the settling time is shorter when the total currents is ten milli-Amperes than when the total currents is zero milli-Amperes.

Figure 10:
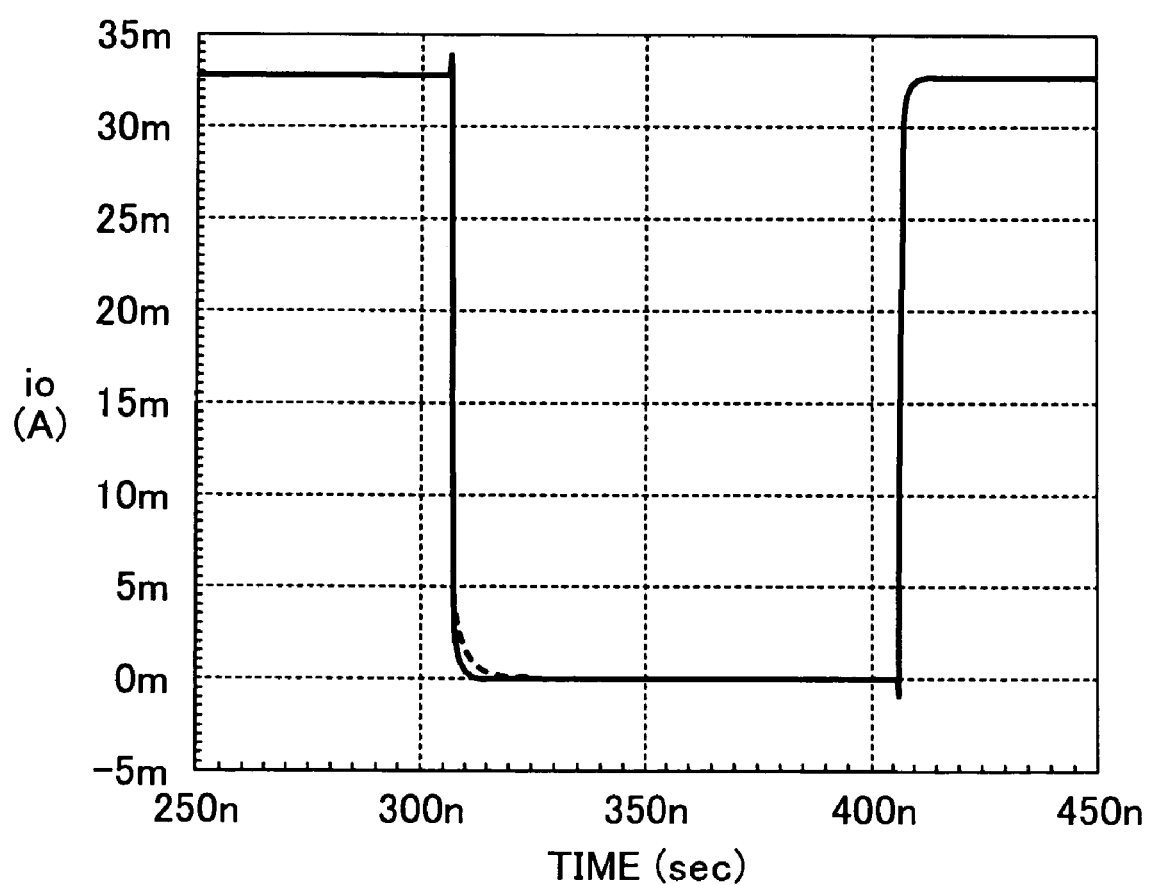
FIG. 10 is a chart illustrating exemplary performance of an output current io generated when only a semiconductor laser driving circuit DRA1 is driven.

Performances of the output current io appearing when only the semiconductor laser driving circuit DRA1 is operated are illustrated in FIG. 10, wherein a rigid line may represent performance of the output current io when a current iC1 is 10 milli-Amperes. A dotted line may represent performance of the output current io when the current iC1 is zero milli-Amperes. As understood therefrom, the settling time is shorter when the currents iC1 is ten milli-Amperes than when the currents iC1 is zero milli-Amperes.

Further, the current flowing to the laser diode LD when the switches SW1 to SWn are turned OFF can be effectively utilized as a read current in an optical disc apparatus, for example. If the current is needless, a suction type constant current source can be employed between an anode of the laser diode LD and ground so as to cancel thereof.

Further, in the first and second preferred embodiments, a size ratio of PMOS transistors may be a prescribed value. For example, when a size of an input side transistor is one, that of an output side transistor is from five to ten. Therefore, the closer the size ratio to one versus five, the larger the consumption current flowing through the semiconductor laser driving circuit. Further, the closer the size ratio to one versus ten, the higher the operational speed of the semiconductor laser driving circuit.

Further, the current mirror circuit may be formed from PMOS transistors of a current disgorging type in the first and second preferred embodiments. However, a current suction type current mirror circuit can be employed while replacing the PMOS transistor and the power supply voltage with an NMOS transistor and ground, respectively.

Obviously, numerous additional modifications and variations of the present invention are possible in light of the above teachings. It is therefore to be understood that within the scope of the appended claims, the present invention may be practiced other than as specifically described in the examples herein. For example, elements and/or features of different illustrative embodiments may be combined with each other and/or substituted for each other within the scope of this disclosure and/or appended claims.

This specification claims priority under 35 USC § 119 to Japanese Patent Application No. 2003-189551 filed on Jul. 1, 2003, the entire contents of which are herein incorporated by reference.

What is claimed is:

1. A semiconductor laser driving apparatus configured to control a semiconductor laser to output a prescribed intensity of laser light, said semiconductor laser driving apparatus comprising:

N semiconductor laser driving circuits, with N being an integer no less than 2, each semiconductor laser driving circuit being configured to output a same prescribed amount of current to the semiconductor laser when the semiconductor laser driving circuit is operated, and each semiconductor laser driving circuit including a current mirror circuit connected between a power supply and said semiconductor laser and configured to output the corresponding prescribed amount of current to the semiconductor laser, said current mirror circuit including an input side transistor Pa of a first size and an output side transistor Pa of a second size;

a control circuit configured to selectively transmit N control signals to the N semiconductor laser driving circuits, in accordance with a prescribed intensity of laser light to be obtained from the semiconductor laser, wherein each control signal selectively controls the corresponding semiconductor laser driving circuit to operate to provide the prescribed amount of current, wherein a ratio of said first size of the input side transistor Pa to said second size of the output side transistor Pb (first size:second size) in the current mirror circuit is in a range of 1:5 to 1:10, each of the first size of the input side transistor Pa and the second size of the output side transistor Pb being calculated based on channel width per channel length.

2. The semiconductor laser driving apparatus according to claim 1, wherein each of said semiconductor laser driving circuits further includes:

a first constant current source configured to allow a prescribed amount of constant current to flow, the current mirror circuit being configured to generate and supply the semiconductor laser with the prescribed amount of current in accordance with the prescribed amount of constant current; and a switch circuit configured to selectively allow the prescribed amount of constant current to flow into the input side transistor of the current mirror circuit in response to the control signal transmitted from the control circuit.

3. The semiconductor laser driving apparatus according to claim 2, wherein said semiconductor laser driving circuit includes a second constant current source configured to always supply a prescribed current to the input side transistor.

4. The semiconductor laser driving apparatus according to claim 1, wherein said semiconductor laser driving circuits are formed on an integrated circuit, and said control circuit is formed on another integrated circuit.

5. The semiconductor laser driving apparatus according to claim 1, wherein said semiconductor laser driving circuits are integrated on a semiconductor chip, and said control circuit is formed on another semiconductor chip, wherein said semiconductor chips form a multiple chip state integrated circuit.

6. The semiconductor laser driving apparatus according to claim 3 further comprising a bypass circuit configured to cause a total current to bypass and substantially not be supplied to the semiconductor laser, wherein said total current is obtained by collecting the currents from the semiconductor laser driving circuits.

7. The semiconductor laser driving apparatus according to claim 6, wherein said semiconductor laser driving circuits and bypass circuit are formed on an integrated circuit, and said control circuit is formed on another integrated circuit.

8. The semiconductor laser driving apparatus according to claim 6, wherein said semiconductor laser driving circuits and bypass circuit arc integrated on a semiconductor chip, and said control circuit is formed on another semiconductor chip, and wherein said semiconductor chips form a multiple chip state integrated circuit.

9. The semiconductor laser driving apparatus according to claim 1, each semiconductor laser driving circuit further comprises a constant current source connected to ground.

10. The semiconductor laser driving apparatus according to claim 1, wherein in each semiconductor laser driving circuit, gates of the input side transistor Pa and the output side transistor Pa, respectively, of the current mirror circuit are connected to each other and are connected to a drain of the input side transistor Pa.

11. The semiconductor laser driving apparatus according to claim 1, wherein in each semiconductor laser driving circuit, the input side transistor Pa and the output side transistor Pa of the current mirror circuit are PMOS transistors.

12. The semiconductor laser driving apparatus according to claim 11, wherein each of said semiconductor laser driving circuits further includes:

a first constant current source configured to allow a prescribed amount of constant current to flow; and a switch circuit configured to selectively allow the prescribed amount of constant current to flow out of a drain of the input side transistor Pa of the current mirror circuit in response to the control signal transmitted from the control circuit.

13. The semiconductor laser driving apparatus according to claim 12, wherein said first constant current source comprises:

an NMOS transistor;

a resistor between a source of the NMOS transistor and ground; and an amplifier having a non-inverting input connected to the source of the NMOS transistor, an inverting input configured to receive a reference voltage, and an output connected to a gate of the NMOS transistor.

14. The semiconductor laser driving apparatus according to claim 12, wherein said first constant current source comprises:

a second current mirror circuit comprising an input side NMOS transistor and an output side NMOS transistor, gates of the input side NMOS transistor and the output side NMOS transistor being connected to each other and being connected to a drain of the input side NMOS transistor; and another constant current source connected to said drain of the input side NMOS transistor.

15. The semiconductor laser driving apparatus according to claim 12, wherein each of said semiconductor laser driving circuits further includes a second constant current source configured to always supply a prescribed current to the input side transistor.

* * * * *